United States Patent
Farkas et al.

(10) Patent No.: US 11,336,264 B1
(45) Date of Patent: May 17, 2022

(54) SYSTEMS AND METHODS FOR VARYING AN IMPEDANCE OF A CABLE

(71) Applicant: Dell Products L.P., Round Rock, TX (US)

(72) Inventors: Sandor Farkas, Round Rock, TX (US); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/088,306

(22) Filed: Nov. 3, 2020

(51) Int. Cl.
*H03K 3/017* (2006.01)
*H03H 7/06* (2006.01)
*H04L 25/02* (2006.01)
*H04B 3/54* (2006.01)

(52) U.S. Cl.
CPC .............. *H03K 3/017* (2013.01); *H03H 7/06* (2013.01); *H04B 3/542* (2013.01); *H04B 3/548* (2013.01); *H04L 25/026* (2013.01)

(58) Field of Classification Search
CPC .......... H03K 3/017; H04L 25/026–028; H01L 2924/3011
See application file for complete search history.

(56) References Cited

U.S. PATENT DOCUMENTS

| | | | | |
|---|---|---|---|---|
| 6,307,352 | B1 * | 10/2001 | Hooper | H02J 7/00711 320/139 |
| 9,160,409 | B2 * | 10/2015 | Kanayama | B60L 53/18 |
| 9,785,214 | B2 * | 10/2017 | Wood, III | G06F 1/26 |
| 10,231,034 | B1 * | 3/2019 | Wu | H05K 7/20736 |
| 10,471,532 | B2 * | 11/2019 | Zucker | B23K 9/091 |
| 10,525,544 | B2 * | 1/2020 | Volzer | B23K 9/1087 |
| 10,532,419 | B2 * | 1/2020 | Zucker | B23K 9/125 |
| 10,749,343 | B2 * | 8/2020 | Gil Lizarbe | H02J 3/50 |
| 2006/0187831 | A1 * | 8/2006 | Justen | G08B 25/009 370/229 |
| 2007/0104338 | A1 * | 5/2007 | Privett | H03F 1/02 381/111 |
| 2012/0187905 | A1 * | 7/2012 | Kanayama | B60L 53/18 320/109 |
| 2013/0251502 | A1 * | 9/2013 | Ketcham | F04D 15/00 415/118 |
| 2016/0111957 | A1 * | 4/2016 | Mathew | H02M 3/1584 323/271 |
| 2016/0254752 | A1 * | 9/2016 | Wood, III | H02M 3/28 363/15 |
| 2017/0120363 | A1 * | 5/2017 | Volzer | B23K 9/0953 |
| 2017/0120364 | A1 * | 5/2017 | Zucker | B23K 9/091 |
| 2017/0120365 | A1 * | 5/2017 | Kooken | B23K 9/1012 |
| 2017/0120366 | A1 * | 5/2017 | Zucker | B23K 9/091 |
| 2017/0310002 | A1 * | 10/2017 | Files | H04L 5/006 |
| 2017/0353036 | A1 * | 12/2017 | Gil Lizarbe | H02J 3/38 |
| 2018/0126477 | A1 * | 5/2018 | Kooken | B23K 9/1043 |
| 2020/0009674 | A1 * | 1/2020 | Zucker | B23K 9/091 |
| 2020/0103307 | A1 * | 4/2020 | Farkas | H05K 7/20218 |

* cited by examiner

*Primary Examiner* — Berhanu Tadese
(74) *Attorney, Agent, or Firm* — Jackson Walker L.L.P.

(57) ABSTRACT

A system may include a transmitter, a receiver, a cable coupled between the transmitter and the receiver and having two wires for communicating a differential signal from the transmitter to the receiver, and a direct-current (DC) voltage source coupled to a first wire of the two wires of the cable and configured to apply a variable DC offset voltage to the first wire in order to vary an impedance of the cable as a function of the variable DC offset voltage.

8 Claims, 2 Drawing Sheets

SYSTEMS AND METHODS FOR VARYING AN IMPEDANCE OF A CABLE

TECHNICAL FIELD

The present disclosure relates in general to information handling systems, and more particularly to systems and methods for varying an impedance of a cable.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In many applications, one or multiple information handling servers may be installed within a single chassis, housing, enclosure, or rack. Communication between or within servers and/or between enclosures may often be accomplished via cables, and many communications standards and protocols employ a copper cable implementation for differential signaling.

One challenge in using cables in information handling systems is that not all communications fabrics are optimized for the same impedance. For example, Peripheral Component Interconnect Express (PCIe) may be optimized with 85-ohm cables, while Serial Attached Small Computer System Interface (SAS) may be optimized with 100-ohm cables. Another challenge is the sheer number of assemblies and part numbers needed to optimize interfaces with varying impedance requirements. Accordingly, there exists a chance of error of building an information handling system with the wrong cable.

With the advent of more complicated and advanced communication interfaces, it is becoming more difficult to satisfy requirements of multiple interfaces that require different impedances. For example, a flexible input/output (I/O) port may be configured for PCIe or Serial Advanced Technology Attachment (SATA), but the cable type may limit to one or the other. One existing solution is to use a cable with 92 ohms of impedance, which is the approximate mean of 85 ohms and 100 ohms. However, this solution is often less than desirable, as use of such impedance may still lead to signal integrity issues and impedance discontinuities.

SUMMARY

In accordance with the teachings of the present disclosure, the disadvantages and problems associated with traditional approaches to use of cables in an information handling system may be substantially reduced or eliminated.

In accordance with embodiments of the present disclosure, a system may include a transmitter, a receiver, a cable coupled between the transmitter and the receiver and having two wires for communicating a differential signal from the transmitter to the receiver, and a direct-current (DC) voltage source coupled to a first wire of the two wires of the cable and configured to apply a variable DC offset voltage to the first wire in order to vary an impedance of the cable as a function of the variable DC offset voltage.

In accordance with these and other embodiments of the present disclosure, a method may include coupling a cable between a transmitter and a receiver, the cable having two wires for communicating a differential signal from the transmitter to the receiver and applying a variable direct-current (DC) offset voltage to a first wire of the two wires of the cable in order to vary an impedance of the cable as a function of the variable DC offset voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
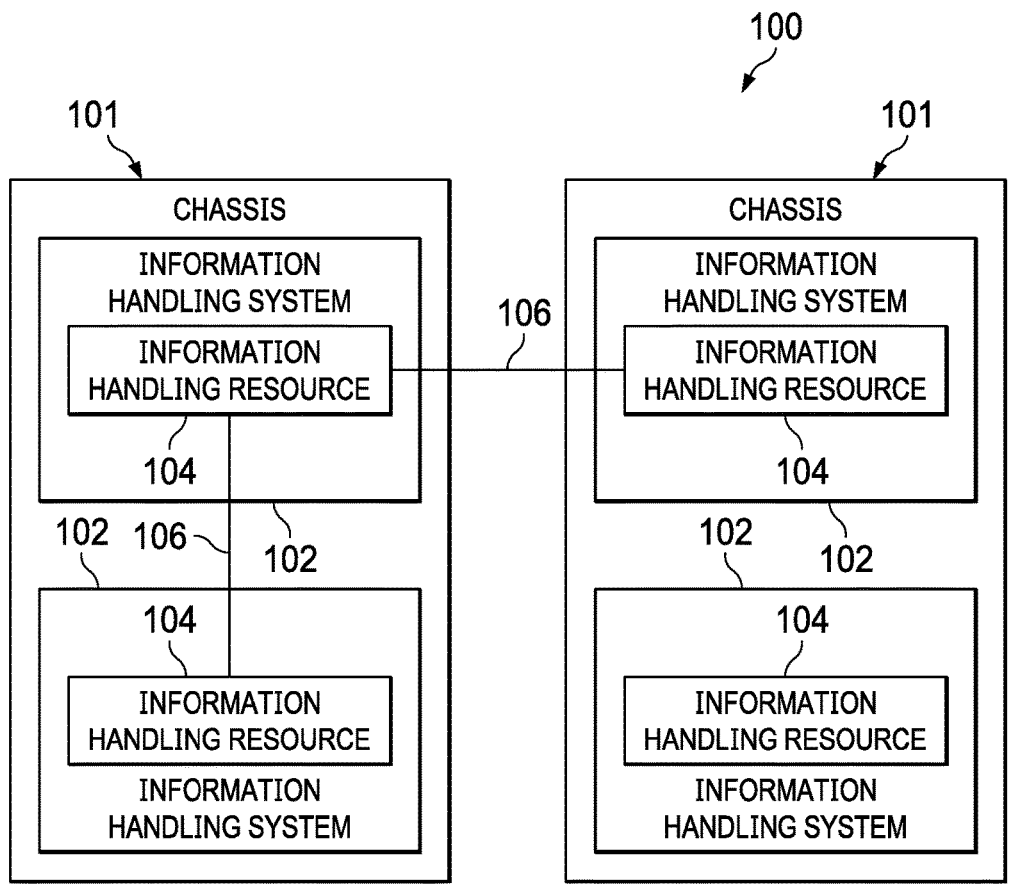
FIG. 1 illustrates a system comprising a plurality of chassis, each chassis comprising at least one information handling system, in accordance with embodiments of the present disclosure.
Figure 2:
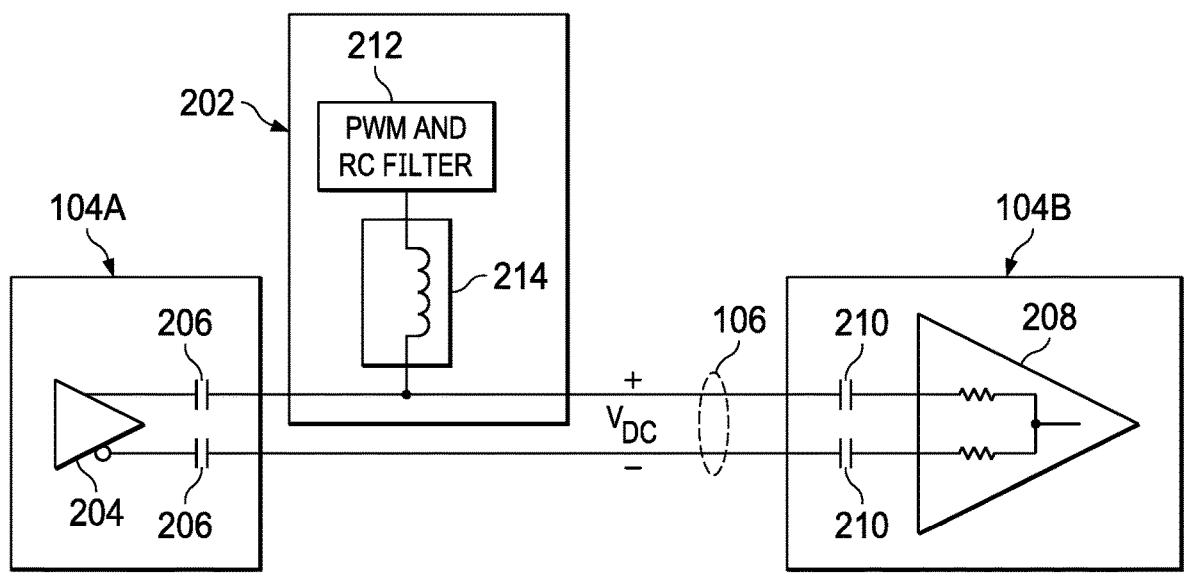
FIG. 2 illustrates a system for varying impedance of a cable, in accordance with embodiments of the present disclosure.
Figure 3:
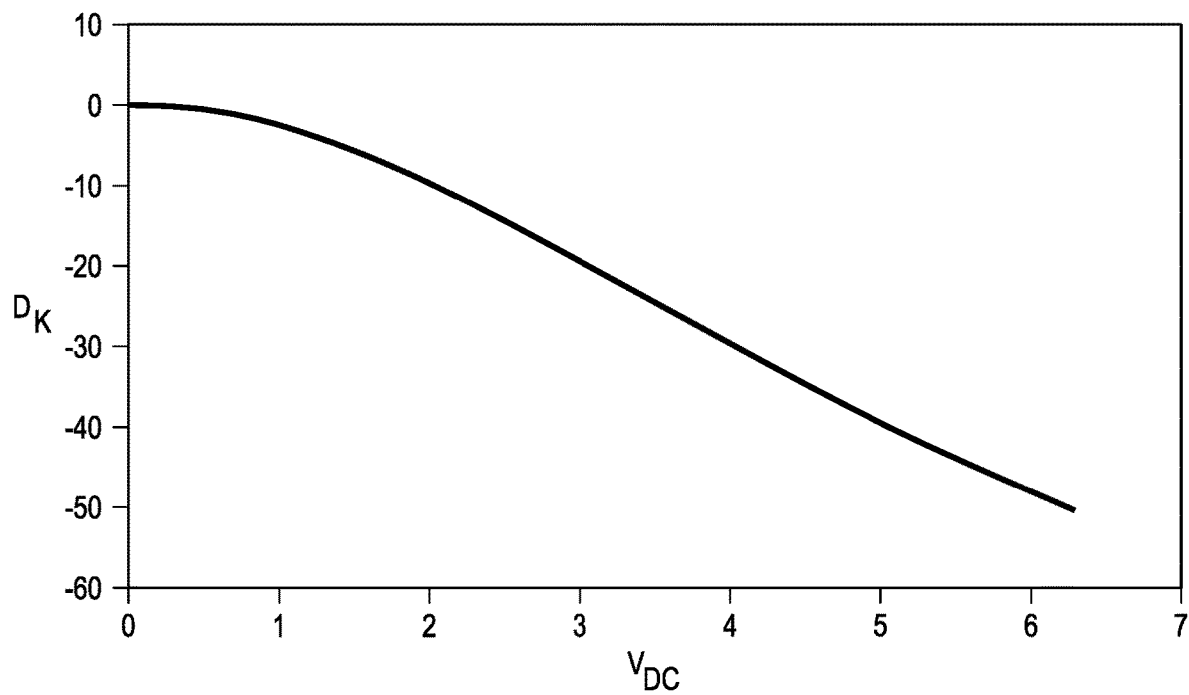
FIG. 3 illustrates an example graph depicting relative permittivity versus direct-current bias voltage in a cable, in accordance with embodiments of the present disclosure.

Preferred embodiments and their advantages are best understood by reference to FIGS. 1 through 3, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, air movers, sensors, power supplies, and/or any other components and/or elements of an information handling system.

FIG. 1 illustrates a system 100 comprising a plurality of chassis 101, each chassis 101 comprising at least one information handling system 102, in accordance with embodiments of the present disclosure. Each chassis 101 may be an enclosure that serves as a container for various information handling systems 102 and information handling resources 104, and may be constructed from steel, aluminum, plastic, and/or any other suitable material. Although the term "chassis" is used, a chassis 101 may also be referred to as a case, cabinet, tower, box, enclosure, and/or housing. In certain embodiments, a chassis 101 may be configured to hold and/or provide power to one or more information handling systems 102 and/or information handling resources 104.

In some embodiments, one or more of information handling systems 102 may comprise servers. For example, in some embodiments, information handling systems 102 may comprise rack servers and each chassis 101 may comprise a rack configured to house such rack servers. As shown in FIG. 1, each information handling system 102 may include one or more information handling resources 104. An information handling resource 104 may include any component system, device or apparatus of an information handling system 102, including without limitation processors, service processors, basic input/output systems, buses, memories, I/O devices and/or interfaces, storage resources, network interfaces, motherboards, air movers, sensors, power supplies, and/or any other components and/or elements of an information handling system. For example, in some embodiments, an information handling resource 104 of an information handling system 102 may comprise a processor. Such processor may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, a processor may interpret and/or execute program instructions and/or process data stored in a memory and/or another information handling resource of an information handling system 102.

In these and other embodiments, an information handling resource 104 of an information handling system 102 may comprise a memory. Such a memory may be communicatively coupled to an associated processor and may include any system, device, or apparatus configured to retain program instructions and/or data for a period of time (e.g., computer-readable media). A memory may include RAM, EEPROM, a PCMCIA card, flash memory, magnetic storage, opto-magnetic storage, or any suitable selection and/or array of volatile or non-volatile memory that retains data after power to an associated information handling system 102 is turned off.

In addition to a processor and/or a memory, an information handling system 102 may include one or more other information handling resources.

As shown in FIG. 1, information handling resources 104 may be communicatively coupled to each other via a cable 106, whether such information handling resources 104 are within different information handling systems 102 in the same chassis 101, or are in different chassis 101. A cable 106 may include any suitable assembly of two or more electrically-conductive wires running side by side to carry one or more signals between information handling resources. In some embodiments, cable 106 may comprise a cable with a varying impedance controlled by a direct-current (DC) voltage source, as described in greater detail below.

FIG. 2 illustrates a system 200 for varying impedance of a cable 106, in accordance with embodiments of the present disclosure. As shown in FIG. 2, system 200 may include a transmitter information handling resource 104A, a receiver information handling resource 104B, a cable 106 coupled between transmitter information handling resource 104A and receiver information handling resource 104B, and a DC voltage source 202 configured to control the impedance of cable 106.

As shown in FIG. 2, transmitter information handling resource 104A may include a driver 204 configured to drive a signal onto cable 106. Transmitter information handling resource 104A may also include alternating current (AC) coupling capacitors 206, each AC coupling capacitor 206 coupled between a respective wire of cable 106 and a respective terminal of driver 204.

As also shown in FIG. 2, receiver information handling resource 104B may also include a receiver 208 configured to receive a signal communicated over cable 106. Receiver information handling resource 104B may also include AC coupling capacitors 210, each AC coupling capacitor 210 coupled between a respective wire of cable 106 and a respective terminal of receiver 208. The AC coupling capacitor 210 coupled to the wire of cable 106 to which DC voltage source 202 is coupled may serve to remove DC offset voltage $V_{DC}$ applied by DC voltage source 202 from the signal communicated over cable 106. The other AC coupling capacitor 210, which may be absent in some embodiments, may be used to maintain balance in the differential communications channel implemented by cable 106.

DC voltage source 202 may include any suitable system, device, or apparatus configured to generate a variable DC voltage offset $V_{DC}$ between the wires of cable 106. Although any suitable architecture for DC voltage source 202 may be used in accordance with this disclosure, an example architecture is shown in FIG. 2 which includes a source block 212 including pulse-width modulation (PWM) signal generator and resistive-capacitive (RC) filter which may control variable DC voltage offset $V_{DC}$ by varying a duty cycle of the PWM signal generated by the PWM signal generator. In the example depicted in FIG. 2, DC voltage source 202 may also include an inductor 214 coupled between source block 212 and a wire of cable 106. Inductor 214 may enable injection of variable DC voltage offset $V_{DC}$ without loading the communications channel implemented by cable 106.

Varying variable DC voltage offset $V_{DC}$ may vary an impedance of cable 106 due to the fact that a relative permittivity $D_k$ of dielectric material of cable 106 may decrease with increasing variable DC voltage offset $V_{DC}$, as shown in FIG. 3. FIG. 3 illustrates an example graph depicting relative permittivity $D_k$ (in terms of a percent change in absolute permittivity) of dielectric material of cable 106 versus variable DC voltage offset $V_{DC}$ applied to cable 106, in accordance with embodiments of the present disclosure. Thus, as variable DC voltage offset $V_{DC}$ increases, the dielectric constant of the dielectric material of cable 106 may decrease.

To explain this phenomenon, a dielectric constant of a material may be defined by:

$$D_k = \frac{E}{E - E_{in}}$$

Where E represents an electric field applied to material and $E_{in}$ represents an induced electric field.

When the molecules of a dielectric material are polarized by applying electric field E, the polarization generates a dipole moment. Due to dipole moment of molecules, induced electric field $E_{in}$ may be formed inside the dielectric material. The polarization vector per unit volume may be given by dipole moment P:

$$P = N\alpha_e E_{in}$$

where N represents a number of molecules per unit volume, which contributes to dipole moment, and where $\alpha_e$ is a polarizability. Corresponding to the dipole moment, a charge density $\rho$, may be given by:

$$\rho = P \cdot \hat{n}$$

where $\hat{n}$ represents a unit vector.

When an applied voltage creates induced electric field $E_{in}$, then the polarization of the molecules may decrease as they are aligned in the same direction. When the polarization decreases, induced electric field $E_{in}$ may decrease. As shown by the equation above for dielectric constant $D_k$, when induced electric field $E_{in}$ decreases, dielectric constant $D_k$ may also decrease.

Impedance of cable 106 may be proportional to $$\frac{1}{\sqrt{D_k}},$$

and thus, increasing variable DC voltage offset $V_{DC}$ may increase impedance of cable 106. Thus, starting with a nominal cable impedance of 85 ohms for cable 106, a suitable variable DC voltage offset $V_{DC}$ may be applied to cable 106 to increase its impedance to 92 ohms or 100 ohms in applications in which such increased impedance is desired.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system, comprising:
    a transmitter;
    a receiver;
    a cable coupled between the transmitter and the receiver and having two wires for communicating a differential signal from the transmitter to the receiver; and
    a direct-current (DC) voltage source coupled to a first wire of the two wires of the cable and configured to apply a variable DC offset voltage to the first wire in order to vary an impedance of the cable as a function of the variable DC offset voltage, wherein the DC voltage source comprises a pulse-width modulation signal generator in combination with a resistive-capacitive filter configured to generate the variable DC offset voltage as a function of a duty cycle of a pulse-width modulation signal generated by the pulse-width modulation signal generator.

2. The system of claim 1, wherein the DC voltage source further comprises an inductor coupled between the first wire and the pulse-width modulation signal generator in combination with the resistive-capacitive filter.

3. The system of claim 1, further comprising an alternating current (AC) coupling capacitor coupled between a first terminal of the receiver and the first wire.

4. The system of claim 3, further comprising a second AC coupling capacitor coupled between a second terminal of the receiver and a second wire of the two wires of the cable.

5. A method, comprising:
   coupling a cable between a transmitter and a receiver, the cable having two wires for communicating a differential signal from the transmitter to the receiver;
   applying a variable direct-current (DC) offset voltage to a first wire of the two wires of the cable in order to vary an impedance of the cable as a function of the variable DC offset voltage; and
   generating the variable DC offset voltage as a function of a duty cycle of a pulse-width modulation signal generated by a pulse-width modulation signal generator in combination with a resistive-capacitive filter.

6. The method of claim 5, further comprising coupling an inductor between the first wire and the pulse-width modulation signal generator in combination with the resistive-capacitive filter.

7. The method of claim 5, further coupling an alternating current (AC) coupling capacitor between a first terminal of the receiver and the first wire.

8. The method of claim 7, further comprising coupling a second AC coupling capacitor between a second terminal of the receiver and a second wire of the two wires of the cable.

* * * * *